(12) United States Patent
Jarrar et al.

(10) Patent No.: US 9,264,021 B1
(45) Date of Patent: Feb. 16, 2016

(54) MULTI-BIT FLIP-FLOP WITH ENHANCED FAULT DETECTION

(71) Applicants: Anis M. Jarrar, Austin, TX (US); John M. Boyer, Austin, TX (US); Saji George, Austin, TX (US); David R. Tipple, Leander, TX (US)

(72) Inventors: Anis M. Jarrar, Austin, TX (US); John M. Boyer, Austin, TX (US); Saji George, Austin, TX (US); David R. Tipple, Leander, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/472,809

(22) Filed: Aug. 29, 2014

(51) Int. Cl.
*H03K 19/003* (2006.01)
*H03K 3/037* (2006.01)
*H03K 19/0175* (2006.01)
*H03K 19/20* (2006.01)
*G06F 11/07* (2006.01)

(52) U.S. Cl.
CPC ............ *H03K 3/0375* (2013.01); *G06F 11/079* (2013.01); *G06F 11/0751* (2013.01); *G06F 11/0793* (2013.01); *H03K 3/0372* (2013.01); *H03K 19/0175* (2013.01); *H03K 19/20* (2013.01)

(58) Field of Classification Search
CPC .............. H03K 3/0372; H03K 3/0375; G06F 11/0751; G06F 11/079
USPC .................................................. 326/9, 12, 38
See application file for complete search history.

(56) References Cited

U.S. PATENT DOCUMENTS

| 5,610,573 | A | 3/1997 | Priebe |
| 5,748,070 | A | 5/1998 | Priebe et al. |
| 5,852,569 | A | 12/1998 | Srinivasan et al. |
| 6,127,864 | A | 10/2000 | Mavis et al. |
| 6,326,809 | B1 | 12/2001 | Gambles et al. |
| 6,549,443 | B1* | 4/2003 | Jensen ............... G11C 11/4125 365/52 |
| 6,668,341 | B1 | 12/2003 | Krauch et al. |
| 6,825,691 | B1 | 11/2004 | Chu et al. |
| 7,298,637 | B2 | 11/2007 | Ma et al. |
| 7,907,461 | B1 | 3/2011 | Nguyen et al. |
| 8,171,386 | B2 | 5/2012 | Chandra et al. |
| 8,185,812 | B2 | 5/2012 | Das et al. |
| 2003/0058017 | A1 | 3/2003 | Humphrey |
| 2010/0088565 | A1* | 4/2010 | Chandra .......... H03K 19/00392 714/746 |
| 2011/0022909 | A1* | 1/2011 | Wang ............... G01R 31/31816 714/726 |
| 2015/0091627 | A1* | 4/2015 | Sharma ............... G06F 11/0793 327/218 |

FOREIGN PATENT DOCUMENTS

EP           0186773 A2     7/1986

* cited by examiner

*Primary Examiner* — Don Le

(57) ABSTRACT

A processing system includes a processor core, a peripheral component, and a flip-flop unit in at least one of the processor core and the peripheral component. The flip-flop unit can include a master latch, and two slave latches coupled to an output of the master latch. The first slave latch is formed over a first doped well region of a semiconductor substrate. The second slave latch is formed over a second doped well region of the semiconductor substrate. A comparator is coupled to an output of the first slave latch and to an output of the second slave latch. An output of the comparator indicates whether a state stored in the first slave latch is the same as a state stored in the second slave latch.

20 Claims, 5 Drawing Sheets

MULTI-BIT FLIP-FLOP WITH ENHANCED FAULT DETECTION

BACKGROUND

1. Field of the Disclosure

The present disclosure relates in general to semiconductor devices, and more specifically to multi-bit master latches with enhanced fault detection.

2. Description of the Related Art

As consumers demand smaller processing devices, the integrated circuits within the devices also must shrink. As the size of the semiconductor memory devices decreases, the bit cell area also decreases, causing an increase in the possibility of failures induced by soft error rate (SER) and/or single event upset (SEU). SER and SEU can occur, for example, when external energy (such as energy due to alpha particle bombardment) is imparted onto the circuit, causing bit values in a memory, voltage detectors and/or other devices, to change to erroneous values. Therefore, as device geometries continue to shrink, error detection becomes increasingly important. Additionally, it is important to reduce power consumed by error detection so that energy costs are reduced and portable devices can operate for longer time periods between battery recharges.

Flip-flops are often used as the basic storage element in circuit design. When the circuit enters a low power mode the clock signal may be deactivated and the flip-flops may transfer the state to low leakage latches (e.g., a balloon latch). When the power supply is restored to the flip-flop, a signal (e.g., restore, active) may be asserted to transfer the state from the latches back to the flip-flops.

BRIEF DESCRIPTION OF THE DRAWINGS

The benefits, features, and advantages of the present disclosure will become better understood with regard to the following description, and accompanying drawings where.

DETAILED DESCRIPTION

Embodiments of systems, devices and methods disclosed herein provide multi-bit flip-flop units with transient fault detection. Each flip-flop unit includes a master latch circuit with two slave latches coupled to the output of the master latch circuit. The slave latches are implemented in different wells in a substrate as far apart as possible from one another so that events causing soft errors or single event upsets in circuitry coupled to one well are less likely to affect circuitry coupled to the other well. The data input to one slave latch can be inverted relative to the other slave latch to improve immunity from common-cause faults. The outputs from both slave latches are compared using an open drain comparator (ODC). The output from multiple ODCs are then connected to an open drain fault bus with a level shifter and provided to a fault collection and control unit. The ODC for each flip-flop can be placed between the slave latches and other unrelated flip-flop to increase lateral distance to corresponding flip-flop. The flip-flop units detect soft or transient errors caused by energetic particles while considerably reducing space requirements and costs associated with completely redundant backup processor cores.

Figure 1:
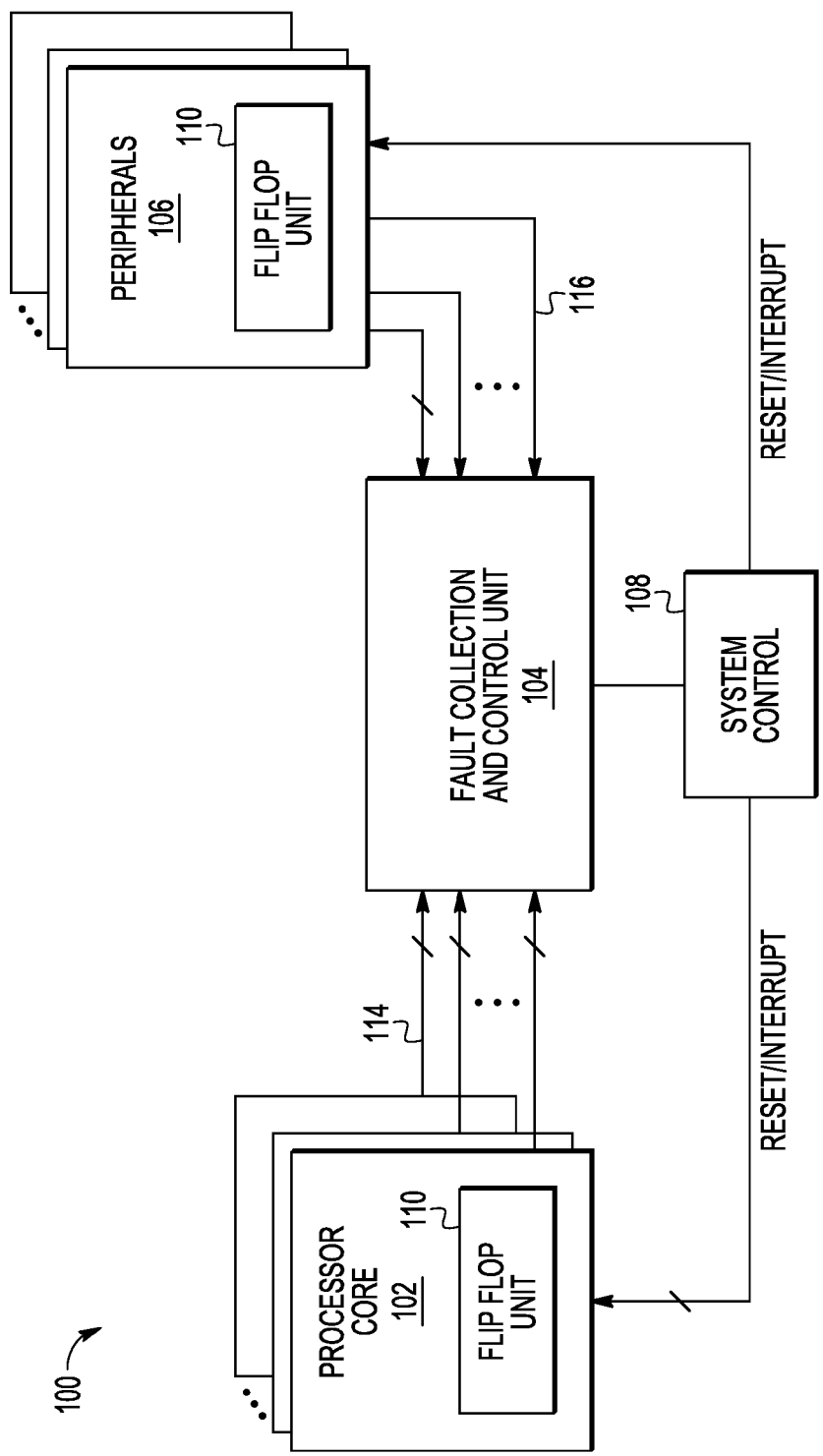
FIG. 1 is a block diagram of a processing system with fault detection and collection capabilities according to one embodiment.

FIG. 1 is a block diagram of a processing system 100 with fault detection and collection capabilities according to one embodiment that includes one or more processor cores 102, fault collection and control unit 104, one or more peripheral devices 106, and system control module 108. Processor core (s) 102 and peripheral device(s) 106 can include one or more multi-bit flip-flop units 110 that are capable of detecting and reporting soft errors in state retaining slave latches associated with the flip-flop units 110 to fault collection and control unit 104 on respective fault buses 114, 116. Fault collection and control unit 104 provides error or fault information from the flip-flop units 110 to system control module 108. The fault information can include the location of the flip-flop units 110 reporting the faults and the number of faults detected per fault bus over a specified period of time. System control module 108 receives the fault information from fault collection and control unit 104 and determines whether to issue a reset or interrupt signal to a processor 102 or peripheral 106 encountering soft errors and/or a single event upset.

Processing system 100 can be any suitable type of computer system and may be implemented as system on chip (SOC) with all components on a single substrate, or as with components implemented on two or more substrates.

Peripherals 106 can include devices implemented with integrated circuit technology such as various types of logic circuitry, memory, low voltage detection circuits, and high voltage detection circuits, among others.

Figure 2:
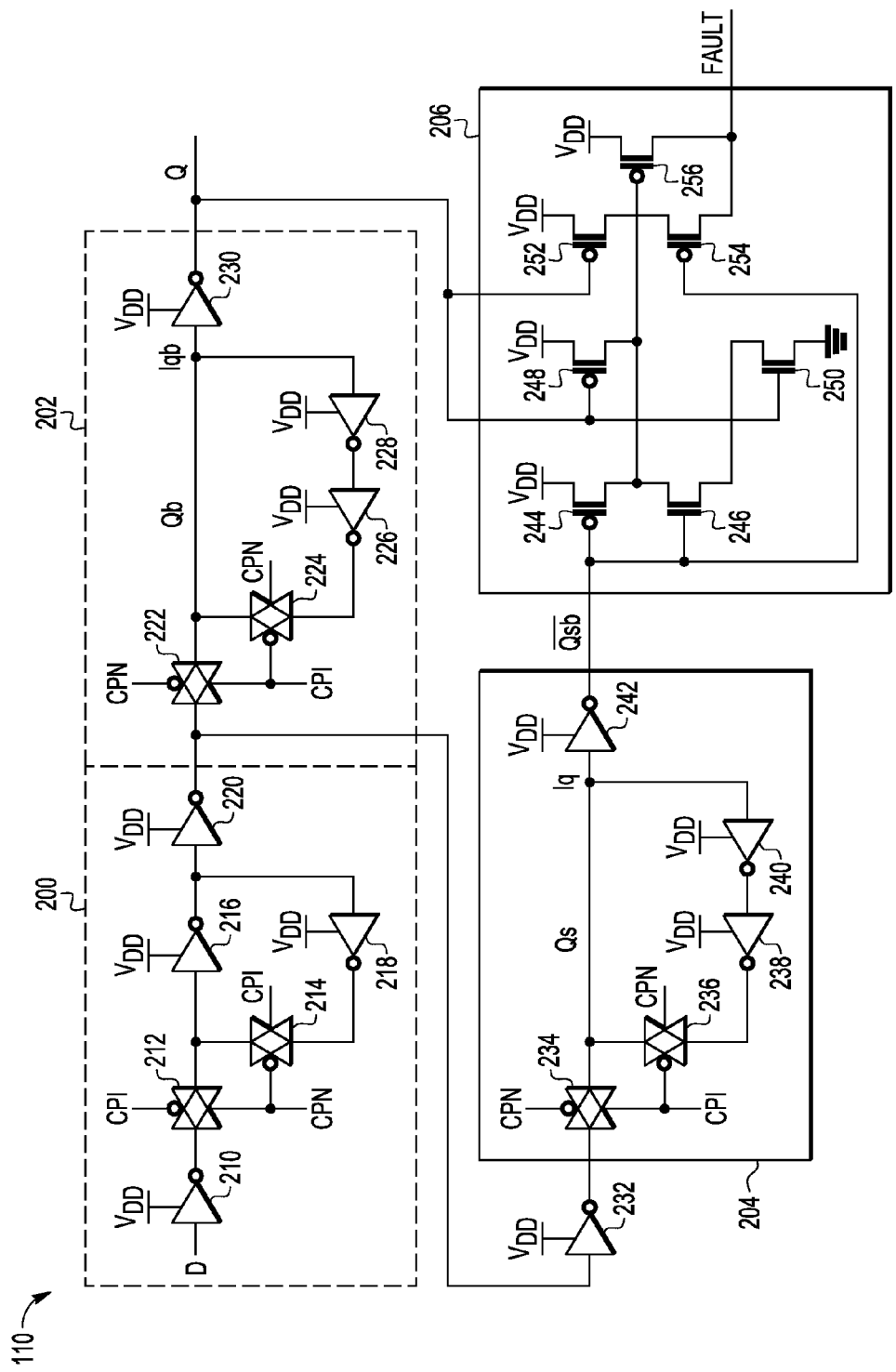
FIG. 2 is a schematic diagram of an embodiment of a master latch and associated slave latches coupled to a comparator that may be included in the flip-flop unit of FIG. 1.

FIG. 2 is a schematic diagram of an embodiment of a master latch 200 and associated slave latches 202, 204 coupled to comparator 206 that may be included in flip-flop unit 110 of FIG. 1. Master latch 200 includes inverters 210, 216, 218, 220 and transmission gates 212, 214. Slave latch 202 includes inverters 226, 228, 230 and transmission gates 222, 224. Slave latch 204 includes inverters 238, 240, 242 and transmission gates 234, 236. Comparator 206 includes P-channel transistors 244, 248, 252, 254, 256 and N-channel transistors 246, 250.

For master latch 200, inverter 210 has an input terminal coupled to receive data (D), a supply voltage terminal coupled to voltage VDD, and an output terminal coupled to an input terminal of transmission gate 212. Inverter 216 has an input terminal coupled to the output terminal of transmission gate 212, a supply voltage terminal coupled to voltage VDD, and an output terminal coupled to an input terminal of inverter 218 and an input terminal of inverter 220. Inverter 218 further has a supply voltage terminal coupled to voltage VDD, and an output terminal coupled to an input terminal of transmission gate 214. Inverter 220 further has a supply voltage terminal coupled to voltage VDD, and an output terminal coupled to an input terminal of transmission gate 222 and an input terminal of inverter 232. Transmission gate 212 is coupled to a true clock signal (CPI) and a complementary clock signal (CPN) and allows the output of inverter 210 to pass to the input terminal of inverter 216 when the true clock signal CPI goes low. Transmission gate 214 is coupled to true clock signal (CPI) and complementary clock signal (CPN) opposite to transmission gate 212 so the output of inverter 218 passes to the input terminal of inverter 216 when the true clock signal CPI goes high, thereby latching the value of the data D.

For slave latch 202, transmission gate 222 is coupled to a true clock signal (CPI) and a complementary clock signal (CPN) to allow the output of inverter 220 to pass to the input terminals of respective inverters 228 and 230 when the true clock signal CPI goes high. Inverter 228 further has a supply voltage terminal coupled to voltage VDD, and an output terminal coupled to an input terminal of inverter 226. Inverter 230 further has a supply voltage terminal coupled to voltage VDD, and an output terminal coupled to control gates of P-channel transistors 248 and 252 and N-channel transistor 250 in comparator 206. Inverter 226 further has a supply voltage terminal coupled to voltage VDD, and an output terminal coupled to an input terminal of transmission gate 224. Transmission gate 224 is coupled to true clock signal (CPI) and complementary clock signal (CPN) opposite to transmission gate 222 so the output of inverter 226 passes to the input terminals of inverters 228 and 230 when the true clock signal CPI goes low, thereby latching the value of the data D.

For slave latch 204, transmission gate 234 is coupled to a true clock signal (CPI) and a complementary clock signal (CPN) to allow the output of inverter 232 to pass to the input terminals of respective inverters 240 and 242 when the true clock signal CPI goes high. Inverter 240 further has a supply voltage terminal coupled to voltage VDD, and an output terminal coupled to an input terminal of inverter 238. Inverter 242 further has a supply voltage terminal coupled to voltage VDD, and an output terminal coupled to control gates of P-channel transistors 244 and 254 and N-channel transistor 246 in comparator 206. Inverter 238 further has a supply voltage terminal coupled to voltage VDD, and an output terminal coupled to an input terminal of transmission gate 236. Transmission gate 236 is coupled to true clock signal (CPI) and complementary clock signal (CPN) opposite to transmission gate 234 so the output of inverter 238 passes to the input terminals of inverters 240 and 242 when the true clock signal CPI goes low, thereby latching the value of the data D.

Note that in the example shown, the input to slave latch 204 is inverted compared to the input to slave latch 202 to help provide immunity to common-cause faults such as signal integrity issues and power supply noise. In embodiments where the input to one of the slave latches 202, 204 is inverted compared to the input to the other slave latch, a fault indicator can be set to indicate a fault when the state of slave latch 202 matches the state of slave latch 204. In other embodiments where the input to one of the slave latches 202, 204 is the same as the input to the other slave latch, a fault indicator can be set to indicate a fault when the state of slave latch 202 does not match the state of slave latch 204. In the other embodiments, the circuitry of comparator 206 will be rearranged to output a high signal when the state of slave latch 202 does not match the state of slave latch 204.

For comparator 206 shown, P-channel transistor 244 has a source terminal coupled to supply voltage VDD, a gate terminal coupled to the output of slave latch 204 and a drain terminal coupled to a drain terminal of N-channel transistor 246 and to the gate electrode of P-channel transistor 256. N-channel transistor 246 further has a gate terminal coupled to the output of slave latch 204 and a source terminal coupled to a drain terminal of N-channel transistor 250. P-channel transistor 248 has a source terminal coupled to supply voltage VDD, a gate terminal coupled to the output of slave latch 202 and a drain terminal coupled to the drain terminal of P-channel transistor 244 and to the gate electrode of P-channel transistor 256. N-channel transistor 250 further has a gate terminal coupled to the output of slave latch 202 and a source terminal coupled to ground. P-channel transistor 252 has a source terminal coupled to supply voltage VDD, a gate terminal coupled to the output of slave latch 202 and a drain terminal coupled to a source terminal of P-channel transistor 254. P-channel transistor 254 further has a gate terminal coupled to the output of slave latch 204 and a drain terminal coupled to the drain terminal of P-channel transistor 256. P-channel transistor 256 has a source electrode coupled to supply voltage VDD, a gate terminal coupled to the drain terminals of P-channel transistors 244, 248, and a drain terminal coupled to the drain terminal of P-channel transistor 254. The output of comparator at the drain terminals of P-channel transistors 254, 256 indicates whether the output of slave latch 202 matched the output of slave latch 204. If the outputs of slave latches 202, 204 do not match, a fault will be indicated by comparator 206.

Figure 3:
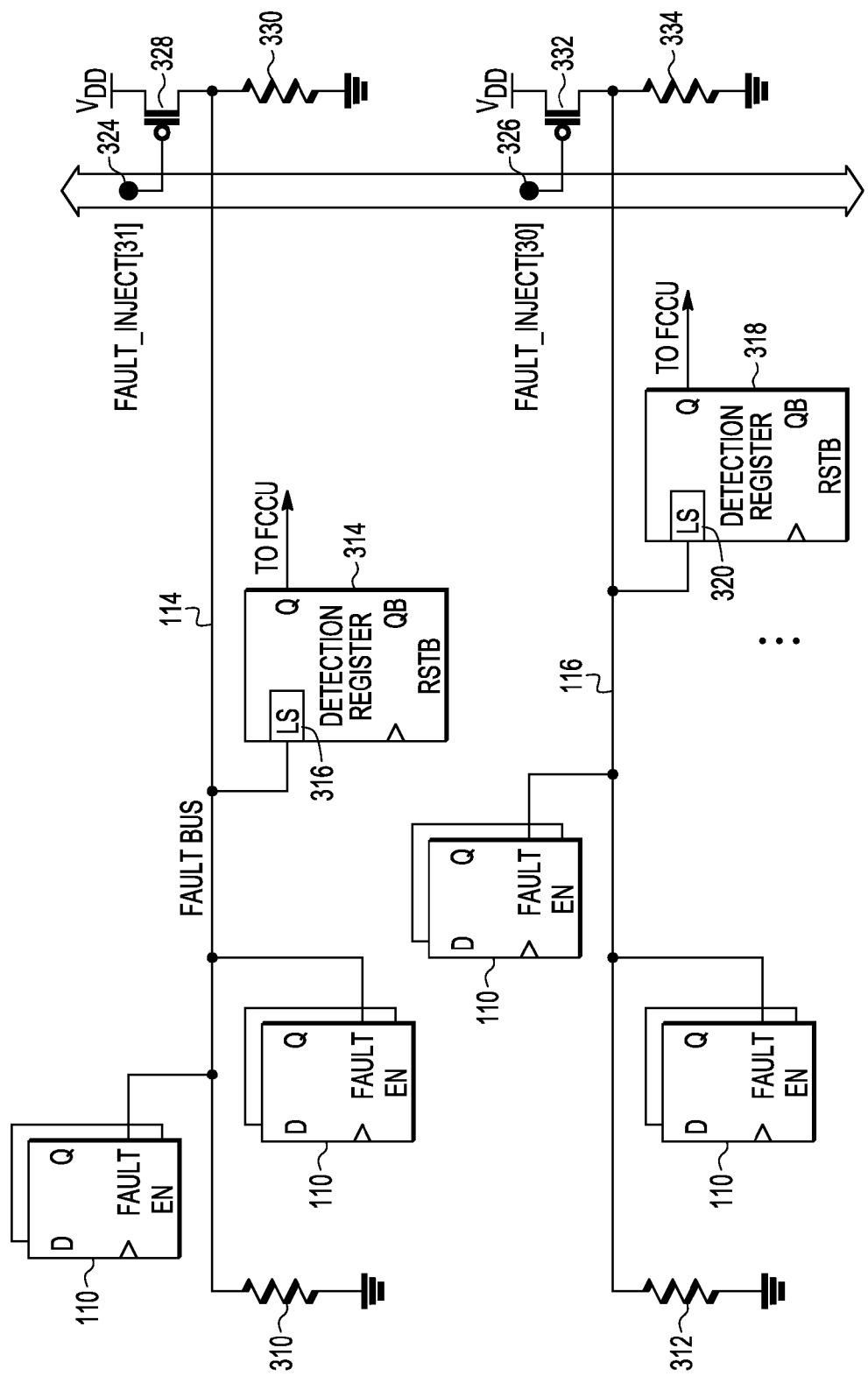
FIG. 3 is a block diagram of an embodiment of fault bus that may be used in the processing system of FIG. 1.

FIG. 3 is a block diagram of an embodiment of fault bus 114 (and 116) that may be used in the processing system 100 of FIG. 1. The output terminal of one or more flip-flop units 110 can be coupled to fault bus 114, 116. One end of each fault bus 114, 116 is coupled to ground through a respective resistor 310, 312. Another end of each fault bus 114, 116 is coupled to ground through respective resistor 330, 334. A pull-up device such as P-channel transistor 328, 332 is coupled in series with a respective one of resistors 330, 334. A source terminal of each P-channel transistor 328, 332 is coupled to supply voltage VDD and a drain terminal of each P-channel transistor 328, 332 is coupled to a first terminal of a respective one of resistors 330, 334. A second terminal of each resistor 330, 334 is coupled to a respective ground or second supply voltage. The resistors 310, 330, 312, 334 coupled to ground may be part of a standard end cap cell. A gate terminal of each P-channel transistor 328, 332 is coupled to a respective fault injection port 324, 326 that allows the fault line on each bus 114, 116 to be pulled high during customer testing and debug.

An input terminal to a level shifter 316, 320 in each of detection registers 314, 318 are also coupled respective fault buses 114, 116. Level shifters 316, 320 translate the combined output signals from all flip-flop units 110 coupled to a respective bus 114, 116 from an attenuated level to a full level before the fault signal is provided to fault collection and control unit 104 (FIG. 1). Detection registers 314, 318 can be implemented with a set/reset latch circuit or other suitable device, with the output of the level shifter 316, 320 providing the input to the latch circuit. The output of each detection register 314, 318 is provided to fault collection and control unit 104.

Note that all flip-flop units 110 coupled to a fault bus 114, 116 can be associated with a particular device or component in processing system. When a fault is detected, fault collection and control unit 104 can report the problem and the fact that the problem is occurring in a specific component, such as a particular processing core 102 or peripheral 106, to system control 108. If a reset or interrupt needs to be issued to correct the problem, the corrective action can be localized to the specific core 102 or peripheral 106 to help minimize impact on the rest of processing system 100.

Figure 4:
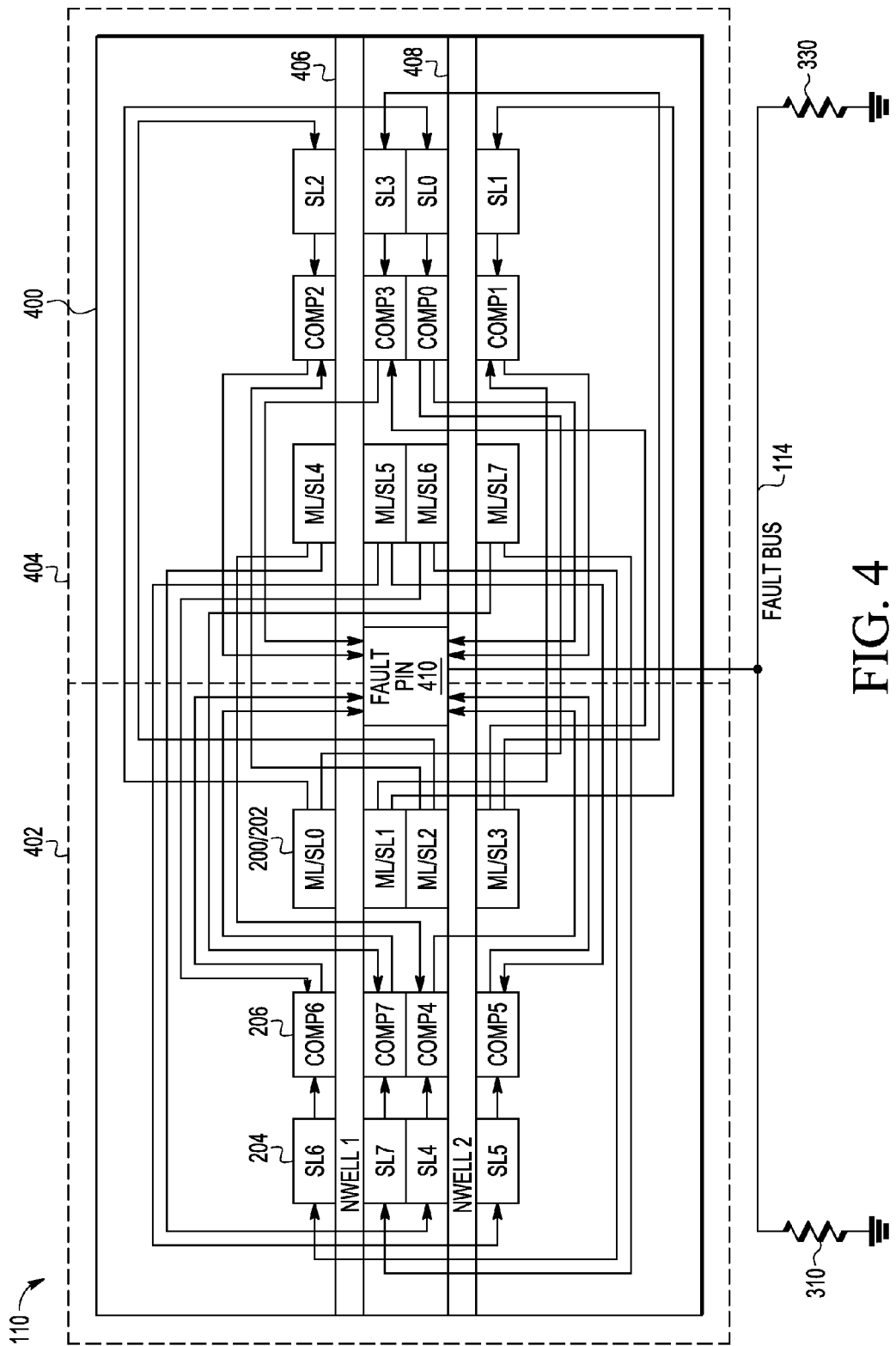
FIG. 4 is a layout diagram of an embodiment of a flip-flop unit that may be used in the processing system of FIG. 1.

FIG. 4 is a layout diagram of an embodiment of an eight bit flip-flop unit 110 that may be used in the processing system 100 of FIG. 1. Flip-flop unit 110 includes a first section 402 with a first set of four master latches 200 coupled to a first set of four slave latches 202 (shown as ML/SL0, ML/SL1, ML/SL2, ML/SL3), a second set of slave latches 204 (shown as SL4, SL5, SL6, SL7), and a second set of comparators 206 (shown as COMP4, COMP5, COMP6, COMP7). Flip-flop unit 110 further includes a second section 404 with a second set of four master latches 200 coupled to a second set of four slave latches 202 (shown as ML/SL4, ML/SL5, ML/SL6, ML/SL7), a first set of slave latches 204 (shown as SL0, SL1, SL2, SL3), and a first set of comparators 206 (shown as COMP0, COMP1, COMP2, COMP3).

Slave latches SL2, SL3, SL6, SL7, comparators COMP2, COMP3, COMP6, COMP7, and master/slave latches ML/SL0, ML/SL1, ML/SL4, ML/SL5 are implemented using a first well 406, which is a doped region in a semiconductor substrate 400.

Slave latches SL0, SL1, SL4, SL5, comparators COMP0, COMP1, COMP4, COMP5, and master/slave latches ML/SL2, ML/SL3, ML/SL6, ML/SL7 are implemented using a second well 408, which is another doped region in a semiconductor substrate 400 that is physically and electrically isolated from first well 406. The output of each comparator 206 is coupled to a fault pin 410 centrally located between first and second portions 402, 404 of flip-flop unit 110. The fault pin 410 is coupled to fault bus 114.

Thus, slave latches SL2, SL3, SL6, SL7 and comparators COMP2, COMP3, COMP6, COMP7 are formed using first well 406 while corresponding master/slave latches ML/SL2, ML/SL3, ML/SL6, ML/SL7 are formed using second well 408. Conversely, slave latches SL0, SL1, SL4, SL5 and comparators COMP0, COMP1, COMP4, COMP5 are formed using second well 408 while corresponding master/slave latches ML/SL0, ML/SL1, ML/SL4, ML/SL5 are formed using first well 406.

Using one of wells 406, 408 to implement one of the slave latches 204, and the other well to implement the master latch 200 and other slave latch 202 increases the probability that both slave latches will not be affected by the same upset event. If both slave latches 202, 204 were implemented in the same well 406 or 408, they would be more likely to be affected by the same upset event. In embodiments where the input to slave latch 204 is not inverted, and a comparison between slave latches 202, 204 indicates they both have the same state, no error will be detected by the comparator even though both slave latches 202, 204 may have changed to an erroneous state during the upset event. In embodiments where the input to slave latch 204 is inverted, and a comparison between slave latches 202, 204 indicates they both have different states, no error will be detected by the comparator even though both slave latches 202, 204 may have changed to an erroneous state during the upset event.

Additionally, slave latches 204 can be positioned as far as possible from master latch 200 and slave latch 202. For example, master latch and slave latch ML/SL0 are positioned in first portion 402 of substrate 400 and corresponding slave latch SL0 is positioned in the second portion 404 of substrate 400. COMP0 is also positioned in the second portion 404 of substrate 400 between master and slave latch ML/SL0 and slave latch SL0 to increase the physical distance between the slave latches 202, 204 to the greatest extent possible.

Figure 5:
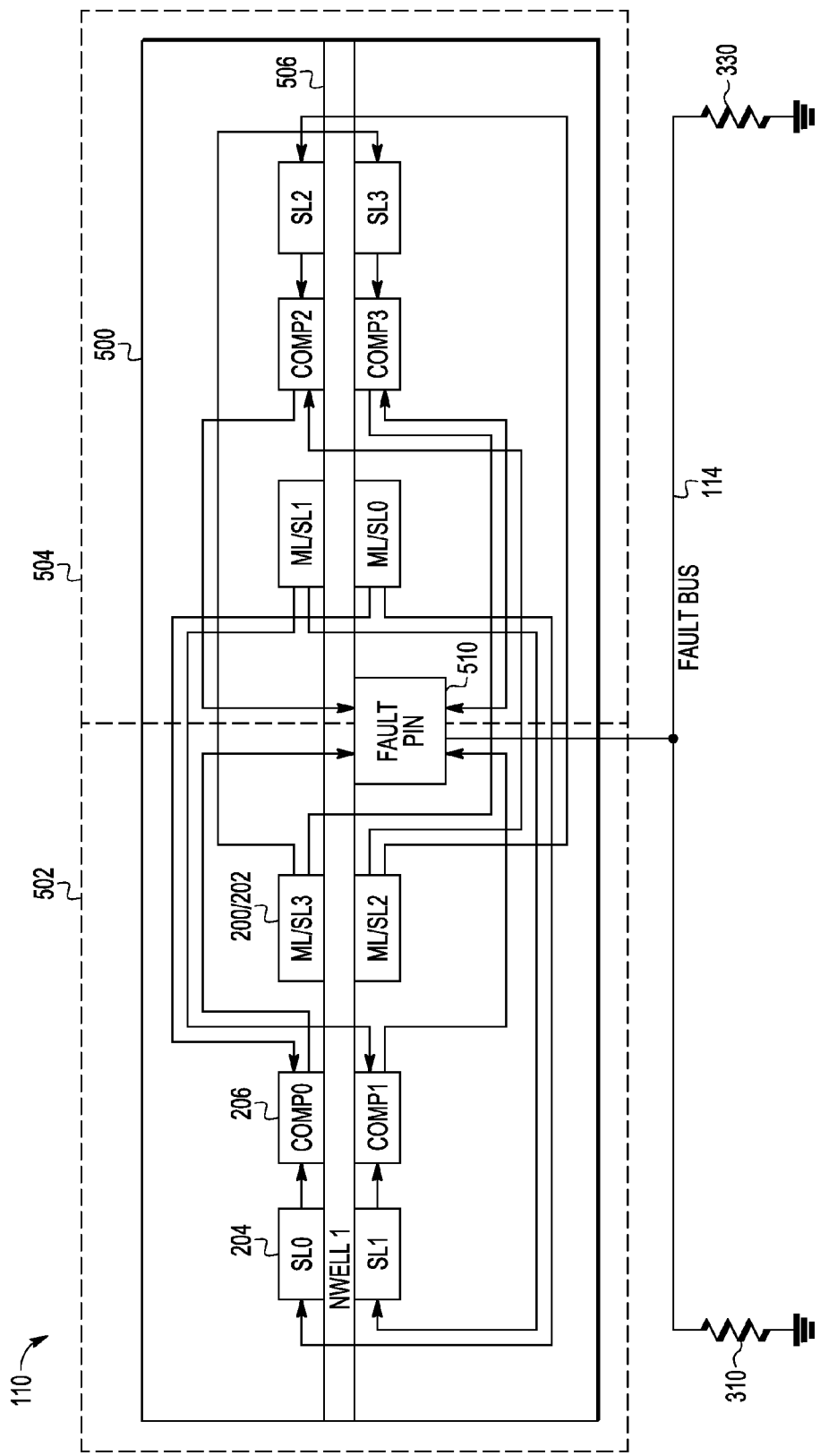
FIG. 5 is a layout diagram of another embodiment of a flip-flop unit that may be used in the processing system of FIG. 1.

FIG. 5 is a layout diagram of an embodiment of a four bit flip-flop unit 110 that may be used in the processing system 100 of FIG. 1. Flip-flop unit 110 includes a first section 502 with a first set of two master latches 200 coupled to a first set of two slave latches 202 (shown as ML/SL2, ML/SL3), a second set of slave latches 204 (shown as SL0, SL1), and a second set of comparators 206 (shown as COMP0, COMP1). Flip-flop unit 110 further includes a second section 504 with a second set of two master latches 200 coupled to a second set of two slave latches 202 (shown as ML/SL1, ML/SL0), a first set of slave latches 204 (shown as SL2, SL3), and a first set of comparators 206 (shown as COMP2, COMP3).

Slave latches 202, 204, comparators 206, and master latches 200 are implemented using a first well 506, which is a doped region in a semiconductor substrate 500.

The output of each comparator 206 is coupled to a fault pin 510 centrally located between first and second portions 502, 504 of flip-flop unit 110. The fault pin 510 is coupled to fault bus 114.

Slave latches 204 can be positioned as far as possible from master latch 200 and slave latch 202. For example, master latch and slave latch ML/SL0 are positioned in first portion 502 of substrate 500 and corresponding slave latch SL0 is positioned in the second portion 504 of substrate 500. COMP0 is also positioned in the second portion 504 of substrate 500 between master and slave latch ML/SL0 and slave latch SL0 to increase the physical distance between the slave latches 202, 204 to the greatest extent possible.

By now it should be appreciated that in some embodiments, a processing system (100) can include a processor core (102), a peripheral component (106), and a flip-flop unit (110) in at least one of the processor core and the peripheral component. The flip-flop unit can include a master latch (200), and two slave latches (202, 204) coupled to an output of the master latch. The first slave latch is formed over a first doped well region of a semiconductor substrate. The second slave latch (204) is formed over a second doped well region of the semiconductor substrate. A comparator (206) is coupled to an output of the first slave latch and to an output of the second slave latch. An output of the comparator indicates whether a state stored in the first slave latch is the same as a state stored in the second slave latch.

In another aspect, the master latch can be formed over the first doped well region.

In another aspect, the second slave latch can be positioned at a distance greater than a closest possible distance from the master latch.

In another aspect, the first slave latch and the master latch can be positioned in a first standard cell and the second slave latch can be positioned in a second standard cell at a farthest possible distance from the first slave latch and the master latch.

In another aspect, the system can further comprise a fault bus. The output of the comparator can be coupled to the fault bus.

In another aspect, the flip-flop unit can further include a plurality of: master latches, first and second slave latches, and comparators, and the output from the comparator and a plurality of outputs from the plurality of comparators can be coupled to the fault bus.

In another aspect, the fault bus can be coupled to a detection register with a level shifter to amplify the output from the comparator and the plurality of outputs from the plurality of comparators.

In another aspect, the fault bus can be connected to end cap cells at both ends of a standard cell row.

In another aspect, one of the end cap cells can include a pull-down device to enable wire-ORing of multiple fault signals, and the system can further comprise a controlled pull-up device to allow fault injection during testing.

In another aspect, the system can further comprise a fault collection and control unit coupled to the fault bus. A fault indication is set when either the state stored in the first slave latch is not the same as the state stored in the second slave latch, and the output of the master latch is input to the second slave latch; or the state stored in the first slave latch is the complement of the state stored in the second slave latch, and the output of the master latch is inverted before being input to the second slave latch.

In another aspect, the system can further comprise a system control unit coupled between the fault collection and control unit and the processor core, and between the fault collection and control unit and the peripheral. The fault indication from the fault collection and control unit can indicate a location of a fault and the system control unit can take corrective action based on the location of the fault indication.

In other embodiments, a flip-flop unit (110) can include a plurality of master latches (200) formed over a first doped well region of a semiconductor substrate, and a plurality of first slave latches (202) coupled to an output of a respective one of the master latches. The first slave latch can be formed over the first doped well region. A plurality of second slave latches (204) can be coupled to the output of the respective one of the master latches. The second slave latch can be formed over a second doped well region of the semiconductor substrate. A plurality of comparators (206) can each be coupled to an output one of the plurality of first slave latches and to an output of one of the plurality of the second slave latches. An output of each of the comparators indicates whether a state stored in the one of the plurality of first slave latch is the same as a state stored in the one of the plurality of the second slave latch. The output of each of the comparators can be coupled to a fault bus.

In another aspect, each of the plurality of the first slave latches and the master latches can be positioned in a respective first standard cell and each of the plurality of the second slave latches can be positioned in a second standard cell. The second standard cell can be at a farthest possible distance from the first slave latch and the flip-clop circuit.

In another aspect, the fault bus can be coupled to a detection register with a level shifter to amplify the output from the outputs of the plurality of comparators.

In another aspect, the fault bus can be connected to an end cap cell at one end and the end cap cell includes a pull-down device to enable wire-ORing of multiple fault signals, and the flip-flop unit can further comprise a controlled pull-up device to allow fault injection during testing.

In another aspect, the plurality of comparators can be positioned between the plurality of master latches and the plurality of second slave latches.

In another aspect, a first half of the plurality of master latches and first slave latches can be positioned in a first column (402) of a layout and a first half of the second slave latches can be associated with the first half of the plurality of master latches and first slave latches are in a second column (404) of the layout. A second half of the plurality of master latches and first slave latches are positioned in the second column of the layout and a second half of the second slave latches associated with the second half of the plurality of master latches and first slave latches are in the first column of the layout.

In still other embodiments, a method can comprise storing an output from a master latch as a state in a first slave latch, and storing the output from the master latch as a state in a second slave latch. The first slave latch and the master latch can be implemented using a first doped well of a semiconductor substrate, and the second slave latch can be implemented using a second doped well of the semiconductor substrate. The state stored in the first slave latch can be compared to the state stored in the second slave latch. A fault indicator can be based on whether the state stored in the first slave latch matches the state stored in the second slave latch.

In another aspect, the method can further comprise taking corrective action in a processing system component based on the fault indicator.

In another aspect, the method can further comprise coupling a plurality of fault indicators to a fault bus, and level shifting the plurality of fault indicators to translate a reduced voltage level on the fault bus to a full voltage level.

This disclosure is presented to enable one of ordinary skill in the art to make and use the present disclosure as provided within the context of a particular application and its requirements. Various modifications to the preferred embodiments will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Processing system 100 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

Although the present disclosure has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present disclosure without departing from the scope of the disclosure as defined by the appended claims.

What is claimed is:

1. A processing system, comprising:
    a processor core;
    a peripheral component;
    a flip-flop unit in at least one of the processor core and the peripheral component, the flip-flop unit including:
        a master latch;
        a first slave latch coupled to an output of the master latch, wherein the first slave latch is formed over a first doped well region of a semiconductor substrate;
        a second slave latch coupled to the output of the master latch, wherein the second slave latch is formed over a second doped well region of the semiconductor substrate; and
        a comparator coupled to an output of the first slave latch and to an output of the second slave latch, wherein an output of the comparator indicates whether a state stored in the first slave latch is the same as a state stored in the second slave latch.

2. The system of claim 1, wherein the master latch is formed over the first doped well region.

3. The system of claim 1, wherein the second slave latch is positioned at a distance greater than a closest possible distance from the master latch.

4. The system of claim 1, wherein the first slave latch and the master latch are positioned in a first standard cell and the second slave latch is positioned in a second standard cell at a farthest possible distance from the first slave latch and the master latch.

5. The system of claim 1, further comprising a fault bus, wherein the output of the comparator is coupled to the fault bus.

6. The system of claim 5, wherein the flip-flop unit further includes a plurality of: master latches, first and second slave latches, and comparators, and the output from the comparator and a plurality of outputs from the plurality of comparators are coupled to the fault bus.

7. The system of claim 6, wherein the fault bus is coupled to a detection register with a level shifter to amplify the output from the comparator and the plurality of outputs from the plurality of comparators.

8. The system of claim 5, wherein the fault bus is connected to end cap cells at both ends of a standard cell row.

9. The system of claim 8, wherein one of the end cap cells includes a pull-down device to enable wire-ORing of multiple fault signals, and the system further comprises a controlled pull-up device to allow fault injection during testing.

10. The system of claim 5, further comprising:
    a fault collection and control unit coupled to the fault bus, wherein a fault indication is set when one of a group consisting of:
        the state stored in the first slave latch is not the same as the state stored in the second slave latch, and the output of the master latch is input to the second slave latch, and
        the state stored in the first slave latch is the complement of the state stored in the second slave latch, and the output of the master latch is inverted before being input to the second slave latch.

11. The system of claim 10, further comprising:
    a system control unit coupled between the fault collection and control unit and the processor core, and between the fault collection and control unit and the peripheral, wherein the fault indication from the fault collection and control unit indicates a location of a fault and the system control unit takes corrective action based on the location of the fault indication.

12. A flip-flop unit including:
    a plurality of master latches formed over a first doped well region of a semiconductor substrate;
    a plurality of first slave latches coupled to an output of a respective one of the master latches, wherein the first slave latch is formed over the first doped well region;
    a plurality of second slave latches coupled to the output of the respective one of the master latches, wherein the second slave latch is formed over a second doped well region of the semiconductor substrate; and
    a plurality of comparators, each comparator is coupled to an output one of the plurality of first slave latches and to an output of one of the plurality of the second slave latches, wherein an output of each of the comparators indicates whether a state stored in the one of the plurality of first slave latch is the same as a state stored in the one of the plurality of the second slave latch;
    a fault bus, wherein the output of each of the comparators is coupled to the fault bus.

13. The flip-flop unit of claim 12, wherein each of the plurality of the first slave latches and the master latches are positioned in a respective first standard cell and each of the plurality of the second slave latches is positioned in a second standard cell, the second standard cell is at a farthest possible distance from the first slave latch and the flip-clop circuit.

14. The flip-flop unit of claim 12, wherein the fault bus is coupled to a detection register with a level shifter to amplify the output from the outputs of the plurality of comparators.

15. The flip-flop unit of claim 12, wherein the fault bus is connected to an end cap cell at one end and the end cap cell includes a pull-down device to enable wire-ORing of multiple fault signals, and the flip-flop unit further comprises a controlled pull-up device to allow fault injection during testing.

16. The flip-flop unit of claim 12, wherein the plurality of comparators are positioned between the plurality of master latches and the plurality of second slave latches.

17. The flip-flop unit of claim 12, wherein:
    a first half of the plurality of master latches and first slave latches are positioned in a first column of a layout and a first half of the second slave latches associated with the first half of the plurality of master latches and first slave latches are in a second column of the layout; and
    a second half of the plurality of master latches and first slave latches are positioned in the second column of the layout and a second half of the second slave latches associated with the second half of the plurality of master latches and first slave latches are in the first column of the layout.

18. A method comprising:
    storing an output from a master latch as a state in a first slave latch;
    storing the output from the master latch as a state in a second slave latch, wherein the first slave latch and the master latch are implemented using a first doped well of a semiconductor substrate, and the second slave latch is implemented using a second doped well of the semiconductor substrate;
    comparing the state stored in the first slave latch to the state stored in the second slave latch;
    providing a fault indicator based on whether the state stored in the first slave latch matches the state stored in the second slave latch.

19. The method of claim 18, further comprising taking corrective action in a processing system component based on the fault indicator.

20. The method of claim 18, further comprising:
coupling a plurality of fault indicators to a fault bus; and
level shifting the plurality of fault indicators to translate a reduced voltage level on the fault bus to a full voltage level.

* * * * *